United States Patent
Monti di Sopra et al.

(10) Patent No.: US 6,862,310 B2
(45) Date of Patent: Mar. 1, 2005

(54) POLARIZATION-STABLE VERTICAL CAVITY SURFACE EMITTING LASER DEVICE AND A METHOD OF STABILIZING THE POLARIZATION OF A VERTICAL CAVITY SURFACE EMITTING LASER DEVICE

(75) Inventors: Fabrice Monti di Sopra, Zurich (CH); Michael Moser, Baden (CH)

(73) Assignee: Avalon Photonics Ltd., Zurich (CH)

( * ) Notice: Subject to any disclaimer, the term of this patent is extended or adjusted under 35 U.S.C. 154(b) by 139 days.

(21) Appl. No.: 10/050,087

(22) Filed: Jan. 14, 2002

(65) Prior Publication Data
US 2002/0110173 A1 Aug. 15, 2002

(30) Foreign Application Priority Data
Jan. 17, 2001 (EP) .............................. 01100995

(51) Int. Cl.$^7$ ............................. H01S 5/00; H01S 3/08
(52) U.S. Cl. ............................................ 372/45; 372/96
(58) Field of Search ............................ 372/45, 96, 46

(56) References Cited

U.S. PATENT DOCUMENTS

| | | | |
|---|---|---|---|
| 4,737,959 A | * 4/1988 | Suyama et al. | 372/44 |
| 5,331,654 A | * 7/1994 | Jewell et al. | 372/45 |
| 5,412,680 A | * 5/1995 | Swirhun et al. | 372/45 |
| 5,436,992 A | 7/1995 | Wang et al. | |
| 6,002,705 A | * 12/1999 | Thornton | 372/96 |
| 6,055,262 A | * 4/2000 | Cox et al. | 372/96 |
| 6,134,251 A | 10/2000 | Kawase et al. | |
| 6,154,479 A | * 11/2000 | Yoshikawa et al. | 372/96 |
| 6,304,588 B1 | * 10/2001 | Chua et al. | 372/46 |

FOREIGN PATENT DOCUMENTS

JP    08340156    12/1996

OTHER PUBLICATIONS diSopra, Continuous–wave operation of phase–coupled vertical–cavity surface–emitting laser arrays, Applied Physics Letters, vol. 77, No. 15, Oct. 9, 2000.
Morgan, et al; Optical characteristics of two–dimensional coherently coupled vertical–cavity surface–emitting laser arrays, Optics Letters, vol. 18, No. 5, Mar. 1, 1993.
M. Orenstein, et al; Large two–dimensional arrays of phase–locked vertical cavity surface emitting lasers, Applied Physics Letters 60, No. 13, Mar. 30, 1992.
Van der Ziel, et al; Characteristics of Single– and Two–Dimensional Phase Coupled Arrays of Vertical Cavity Surface Emitting GaAs–AlGaAs Lasers; IEEE Journal of Quantum Electronics, vol. 26, No. 11; Nov. 1990.

* cited by examiner

Primary Examiner—Paul Ip
Assistant Examiner—Hung T Vy
(74) Attorney, Agent, or Firm—Fattibene & Fattibene; Paul A. Fattibene; Arthur T. Fattibene (57) ABSTRACT

A method is disclosed in which the principle of phase-coupling is used to stabilize the polarization of laser radiation emitted by a plurality of phase-coupled vertical cavity surface emitting laser elements. Due to a suitable coupling strength between adjacent VCSEL elements, the probability of polarization flips of VCSEL devices operated in the single mode region is zero or at least drastically reduced. Moreover, a VCSEL device is disclosed, comprising a polarization adjusting means for controlling the polarization direction of an arrangement of a plurality of phase-coupled VCSEL elements, wherein the polarization direction of each VCSEL element is substantially kept constant.

47 Claims, 2 Drawing Sheets

POLARIZATION-STABLE VERTICAL CAVITY SURFACE EMITTING LASER DEVICE AND A METHOD OF STABILIZING THE POLARIZATION OF A VERTICAL CAVITY SURFACE EMITTING LASER DEVICE

FIELD OF THE INVENTION

The present invention relates to a vertical cavity surface emitting laser (VCSEL) device including a plurality of phase-coupled VCSEL elements, a top distributed Bragg reflector, a phase-matching layer and a metal grid defining two or more radiation windows of the VCSEL device. Furthermore, the present invention relates to a method of stabilizing the polarization of a VCSEL device.

BACKGROUND OF THE INVENTION

Vertical cavity semiconductor lasers have attracted increasing interest for a large number of applications. For example, single-mode devices with limited output power and high spectral purity are employed for sensing, pumping, spectroscopic applications and/or high-speed data communication. It should be noted that throughout this application, the term "single mode" refers to a single transverse radiation mode. Multi-mode devices, on the other hand, are used in applications demanding less spectral qualities but a higher degree of output power. A suitable measure to increase the output power of a vertical cavity surface emitting laser device resides in the possibility to manufacture a plurality of single elements on a common substrate and to arrange them as an array. Contrary to edge-emitting laser arrays, the unique configuration of vertical cavity surface emitting lasers allows the realization of densely packed two-dimensional arrays. In applications merely requiring high output power, coherence of the radiation emitted by the laser array may not play an important role. In many applications, however, low beam divergence and high spectral purity are critical parameters that do not permit the employment of non-coherent arrays. For these spectrally more demanding applications, arrays of phase-locked lasers may be arranged in such a way that the arrays select a single transverse radiation mode for the whole array. With this technique, focused diffraction-limited far-field beams can be achieved in spectrally pure, high-power single-mode VCSEL arrays.

Phase-locked VCSEL arrays have been investigated and several different designs, mostly for bottom emitting devices, have been proposed and tested. In "Continuous Wave Operation of Phase-Coupled Vertical Cavity Surface Emitting Laser Arrays" in Applied Physics Letters, volume 77, number 15, Oct. 9, 2000 by Monti di Sopra, et al, arrays of vertical cavity surface emitting lasers are described. These laser arrays are realized by patterning the reflectivity of the top distributed Bragg reflector using a phase-matching layer and a metal grid. For an improved current injection and better heat dissipation, the devices were selectively oxidized. With these arrays, a continuous wave operation at room temperature has been achieved at 960 nm.

Commonly, VCSEL devices are manufactured on a substrate having a crystallographic surface orientation [100]. When injecting current into the active region of the VCSEL, laser radiation is generated and coupled out of the device in the [100] direction. The emitted radiation typically shows a linear polarization along the [011] or [01-1] direction, except for a small elliptical component. Unfortunately, VCSELs operated in a single mode, i.e. VCSELs having an optically confining resonator that substantially favors a single transverse mode oscillation over a certain current range, tend to abruptly change the polarization direction, particularly when the injection current is increased or when the temperature is changed. These spontaneous changes of the polarization direction, i.e. from the [011] to the [01-1] direction and vice-versa, are also referred to as polarization flips. The frequency separation between the two orthogonally polarized components of the fundamental mode is between 0 and 50 GHz, depending on the device. Apart from this wavelength shift, a polarization flip also drastically increases the intensity noise. Since many applications, for example, in optical communication systems, in sensing, spectroscopy or pumping, and the like, are polarization, noise or wavelength sensitive, uncontrolled polarization flips may drastically degrade the performance of VCSEL devices, or even completely inhibit the employment of such devices for these corresponding applications.

In view of the above-mentioned problems, there exists a need for a method of operating a VCSEL device in such a way that the radiation emitted from this device is substantially coherent and spontaneous polarization flips are substantially avoided within an injection current range defining a single mode operation area.

Furthermore, a need exists for a VCSEL device exhibiting a high output power thereby substantially avoiding spontaneous polarization flips when operated as a single mode device.

SUMMARY OF THE INVENTION

According to one aspect of the present invention, a method of stabilizing the polarization of a vertical cavity surface emitting laser device comprises: providing two or more VCSEL elements capable of substantially emitting single mode radiation of substantially the same wavelength and arranged to allow phase-coupling between said two or more VCSEL elements, and initiating emission of radiation by injecting current into the two or more VCSEL elements to produce a phase-coupled radiation, wherein the polarization direction of each of the two or more VCSEL elements remains substantially constant during operation.

As previously described, VCSEL elements tend to spontaneously change their polarization direction in a single mode operation, especially when the injection current is increased. The present invention is based on the inventors' finding that operating two or more VCSEL elements in a phase-coupled mode avoids spontaneous polarization flips or at least extremely reduces the probability for such polarization flips. Although the exact physical mechanism is not yet clear, it is assumed that locally occurring quantum-mechanical fluctuations, which may otherwise cause a polarization flip in a single independently operated VCSEL element, cannot effect a change of the state of the radiation field due to the relatively strong coupling to the radiation field of an adjacent VCSEL element that does not experience the same quantum-mechanical fluctuations. For example, corresponding experiments carried out by the inventors showed that an array of 2×2 VCSEL elements each having a square shaped radiation emitting surface of 4×4 $\mu m^2$ separated by 1 $\mu m$ wide stripes of a metal grid does not exhibit any polarization flips within the entire injection current range that allows a single mode operation of the VCSEL elements. Moreover, already the arrangement of two phase coupled VCSEL elements leads to an extremely reduced probability for a polarization flip in, each of the two elements over a wide range of injection currents. Thus, by applying the principle of phase-coupling of adjacent VCSEL elements to the problem of polarization stabilizing of vertical cavity surface emitting lasers operated as single mode elements, as described in the present invention, a coherent radiation source with a stable polarization direction and having an output power depending on the number of VCSEL elements and the injected current is provided. Accordingly, a plurality of VCSEL elements arranged and operated as herein described allows the employment and spectrally demanding and polarization-sensitive applications.

In a further embodiment, the method provides a phase-coupling region between adjacent VCSEL elements, the phase-coupling region having a lateral dimension and a longitudinal dimension, substantially perpendicular to the emission direction of the VCSEL elements, wherein the lateral dimension is less than the longitudinal dimension and wherein the lateral dimension is in the range of about 7 $\mu$m to about 0.1 $\mu$m.

By providing a phase-coupling region between adjacent VCSEL elements with dimensions as specified above, the coupling strength between adjacent VCSEL elements may be adjusted in conformity with design requirements. A distance between VCSEL elements defined by said lateral dimension, on the one hand, ensures that adjacent VCSEL elements will not operate as one large VCSEL element, and on the other hand, provide a sufficient coupling strength between the adjacent radiation fields so as to achieve coherence between the radiation emitted by the adjacent VCSEL elements. By setting a maximum lateral dimension to about 7 $\mu$m, it is guaranteed that adjacent VCSEL elements will not behave like individual uncorrelated laser emitters.

According to a further embodiment, in each VCSEL element, a radiation window is provided with a size from about 40 $\mu$m$^2$ to about 1 $\mu$m$^2$.

In general, the size of a radiation window of a VCSEL element is frequently a compromise between the desire for a stable single mode operation and a required high output power. A reduction in size of the radiation windows stabilizes a single mode operation of the device over a wide injection current range, but on the other hand, reduces the size of the available resonator volume and hence decreases the output power emitted from the VCSEL element. In polarization-sensitive applications requiring a higher output power using a plurality of individual emitters is not practical since the individual emitters will frequently change the polarization direction. Accordingly, the present invention allows to vary the size of the radiation window in accordance with design requirements wherein a large number of small-sized radiation windows for stabilizing the single mode operation may be provided to increase the overall output power but which do not exhibit any polarization flips.

In a further embodiment, a reflectivity difference between a resonator region corresponding to a radiation window of each of the VCSEL elements and a phase-coupling region provided between adjacent VCSEL elements is selected to be within about 0.5 to 15%.

By selecting the reflectivity difference between a region of the resonator corresponding to a radiation window and a region separating two adjacent VCSEL elements, a single mode can be enhanced by increasing the mirror loss for all other modes and at the same time the coupling strength between adjacent elements may be adjusted since the coupling strength depends on the number of cross-scattered photons, i.e. on the number of photons reflected by the phase-coupling region into the neighboring VCSEL element. For example, a reflectivity difference of about 1.5% allows relatively large VCSEL elements of 4×4 $\mu$m$^2$, wherein the coupling strength is maintained sufficiently high so as to avoid any polarization flips of the individual VCSEL elements. Furthermore, in view of output power, it is preferable to minimize the region covered by the phase-coupling region, such as a metal grid provided on one of the mirrors of the laser device, to obtain a maximum output from a minimum substrate area, the phase-coupling region, i.e. the stripes of the metal grid, may be scaled down to about 0.1 $\mu$m with a correspondingly increased reflectivity difference of about 1–15% For stripes ranging from about 1 $\mu$m to about 7 $\mu$m, preferably the reflectivity difference may be adjusted to approximately 0.5% to 10%. This relatively large reflectivity difference then maintains the coupling strength between adjacent laser elements at a required low level to avoid a radiation mode in which adjacent VCSEL elements emit as one single laser.

In a further variation, 2–5 VCSEL elements are provided. Applying the principle of phase-coupling to polarization-stabilizing allows the operation of only few VCSEL elements in single mode without polarization flips. This may be advantageous in polarization-sensitive applications requiring merely the output of only a few VCSEL devices.

In a further embodiment, two or more VCSEL elements are top-emitting VCSEL elements. Compared to bottom-emitting devices, the top emitting design in general exhibits a higher mirror reflectivity and thus the mirror losses are much smaller leading to an increased output power.

In a further modification, the phase-coupling region is provided, at least partially, as an electrically conductive material. This measure allows to separate adjacent VCSEL elements by, for example, a metal grid, which may be connected to a power supply to provide current into the active regions of the VCSEL elements.

In a further embodiment, the phase-coupling region is provided on top of a distributed Bragg reflector to define radiation windows.

The provision of the phase-coupling region) on top of a distributed Bragg reflector combines the advantage of a higher reflectivity of the reflector with a simple manufacturing procedure in accordance with standard process technologies.

In a further embodiment, the phase-coupling region is provided as a grid layer vertically arranged between a first mirror means and a second mirror means forming a resonator of the VCSEL elements.

According to this embodiment, the phase-coupling region, for example, in the form of a metal grid, is provided between the reflectors and is thus closely arranged at the active region of the VCSEL elements. In combination with a Bragg reflector, which may be formed by, for example, wafer bonding or a regrowth method after formation of the phase-coupling region, considerably higher reflectivity differences between the phase-coupling region and the remaining resonator array are obtained, and hence, the lateral separation of adjacent VCSEL elements may accordingly be reduced to obtain a high output power efficiency from a given substrate area.

In a further embodiment, a second phase-coupling region is provided, dividing each of the VCSEL elements into two or more sub portions wherein the second phase-coupling region exhibits a second reflectivity difference that differs from the reflectivity difference of the phase-coupling region.

According to this embodiment, the second phase-coupling region allows a further reflectivity modulation in individual VCSEL elements. The further reflectivity modulation may be adjusted in conformity With the crystallographic orientation of the substrate on which the VCSEL elements are formed in order to select the initiat polarization of the individual VCSEL elements, wherein, due to the principle of the present invention, the initial polarization direction is maintained substantially over the entire single mode operation region.

In a further variation, the two or more VCSEL elements are arranged as an array defined by the phase coupling region formed on top of a top Bragg reflector of the VCSEL elements. The arrangement of the VCSEL elements as a regular two-dimensional array defined by the phase-coupling region, for example in the form of a metal grid, is fully compatible wits standard manufacturing procedures while the provision of the phase-coupling region on top of a top Bragg reflector ensures a high efficiency of the entire device, as previously described.

In a further embodiment, the phase-coupling region is provided, at least partially, as a conductive grid layer used to inhomogeneously inject current. By this measure, current can be injected inhomogeneously depending on the locations, where the grid layer is electrically conductive. Accordingly, the injection current is locally distributed in conformity with the conductive portions of the grid layer which may be arranged in accordance with the crystallographic orientation of the substrate to achieve a required initial polarization direction of each of the individual VCSEL elements. In particular, a combination of a partially conductive grid layer as the phase-coupling region and a second phase-coupling region, as described above and mainly comprising a non-conductive material, may result in a modulation of the injection current arid the reflectivity difference in the individual VCSEL elements so as to obtain the required initial polarization direction.

In a further embodiment, stripes of the grid layer extending along a first direction and stripes extending along a second direction are supplied with different currents respectively. Accordingly, the current distribution of the VCSEL elements may be adjusted in conformity with a required initial polarization direction. For example, by changing the current applied to the respective stripes, a current distribution can be modulated to correspond to the polarization direction that is 90° perpendicular to the initial polarization direction. Hence, different initial polarization directions can be selected during turning on of the elements and/or the polarization direction during operation may be switched.

In a further variation, each radiation emitting surface of the VCSEL elements is substantially of square shape, rectangular shape, diamond shape or of hexagonal shape. This arrangement allows a plurality of configurations to select the number of nearest neighbors, the type of coupling, i.e. in phase-coupling or out of phase-coupling, and the like, as a matter of design in accordance with standard manufacturing procedures of VCSEL devices.

In a further embodiment, the array of VCSEL elements is asymmetric. This configuration easily allows the implementation of a certain degree of anisotropy with respect to the crystallographic orientation of the substrate so as to favor a pre-determined polarization direction of the VCSEL elements.

In a further embodiment, a strain element is provided to produce orientation dependent strain in one or more of the VCSEL elements. The provision of the strain element allows the selection of a desired polarization direction due to the anisotropic application of strain in one or more of the VCSEL elements.

In a further embodiment, a means for selecting the orientation of the strain is provided. By providing a means for selecting the orientation of the strain, for example, in the form of a controllable heating means that deposits selectively and locally limited heat in one or more VCSEL elements to cause anisotropic thermal stress, a pre-defined polarization direction may be selected.

In a further embodiment, the VCSEL elements are operated in a continuous wave mode. This modification advantageously allows the employment of the present invention for applications that require a coherent polarization-stable continuous output power.

According to another aspect of the present invention, a polarization-stable VCSEL device comprises an array of 2–5 phase-coupled VCSEL elements capable of emitting in a single mode, whereby, during operation, the polarization direction of each of the VCSEL elements remains substantially constant.

As previously described, an array of few VCSEL elements is provided comprising the advantages as pointed out above.

According to still another aspect of the present invention, a polarization-stable VCSEL device is provided, comprising: a plurality of phase-coupled VCSEL elements, and a polarization adjusting means to select a polarization direction in one or more of the phase-coupled VCSEL elements.

The advantages obtained by a VCSEL device having means for adjusting a polarization direction, which then does not exhibit any polarization flips due to the phase-coupling of the plurality of VCSEL elements, are already pointed out above.

In a further embodiment, the polarization adjusting means comprises a strain element causing orientation-dependent strain in one or more of the phase-coupled VCSEL elements.

In a further embodiment, the strain element comprises a strain layer including one or more shrunk material layers to create the orientation-dependent strain.

Shrinkage of material layers of VCSEL devices is a standard manufacturing procedure, for example, when oxidizing aluminum-containing layers of the Bragg reflector are selectively oxidized so that by providing an orientation-dependent form of the mesa containing, the top Bragg reflector, the shrunk material layers exert orientation-dependent strain to the resonator region and/or active region of the VCSEL device.

In a further embodiment, the polarization adjusting means comprises electrodes to inject current into the VCSEL elements in an orientation-dependent fashion. The electrodes for injecting orientation-dependently current into the VCSEL elements allow the selection of an initial polarization direction.

In a further embodiment, the plurality of phase-coupled VCSEL elements are arranged in an array defined by a grid larger comprising electrically conductive portions.

According to a further embodiment, that array is asymmetric.

In a further embodiment, each element of the array is of square shape or rectangular shape.

In a further embodiment, respective emission windows of the plurality of VCSEL elements are of polygonal shape.

In a preferred embodiment, the VCSEL device further comprises a phase-matching layer on top of a distributed Bragg reflector, wherein the phase-matching layer adjusts a reflectivity difference of the VCSEL resonator area below a radiation window and of a region separating two adjacent VCSEL elements to about 0.5–5%.

A phase-matching layer allows, for example, by adapting the optical thickness of the phase-matching layer to the optical characteristics of the distributed Bragg reflector, to determine in advance the reflectivity difference, which in turn, affects the mode selectivity and the coupling strength between adjacent VCSEL elements as previously described. Accordingly, due to the phase-coupling of the VCSEL elements that is achieved by means of the reflectivity difference adjusted by the phase-matching layer, an initial polarization direction adjusted by the polarization adjusting means is maintained.

In a further embodiment, the VCSEL device further comprises a phase-coupling region arranged within a resonator of the VCSEL device.

According to this arrangement, the phase-coupling region is arranged more closely to the active region of the VCSEL device such that a reflectivity difference between an undisturbed resonator region and a region corresponding to the phase-coupling region is relatively large, for example, the reflectivity difference is larger than about 3%. Accordingly, adjacent VCSEL elements may be closely spaced with a small phase-coupling region arranged therebetween wherein the large reflectivity difference ensures an appropriate coupling strength between adjacent VCSEL elements to avoid any polarization flips of individual elements.

Further advantages, objects and embodiments of the present invention are defined in the appended claims.

With reference to the accompanying drawings, the present invention will be described in more detail by way of example. In the drawings:

DETAILED DESCRIPTION OF THE PREFERRED EMBODIMENTS

Figure 1:
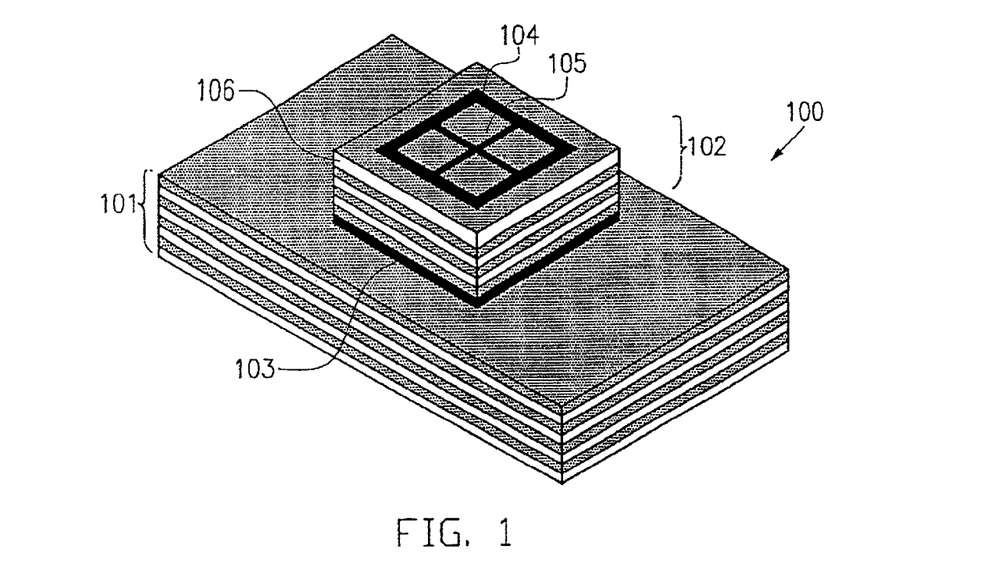
FIG. 1 is a schematic perspective view of an embodiment of a polarization stable VCSEL device operated in accordance with the present invention.

FIG. 1 is a perspective schematical view of an embodiment of a VCSEL device 100 in accordance with the present invention. In FIG. 1, the VCSEL device 100 comprises a distributed bottom Bragg reflector 101 including a stack of layers having in an alternating fashion, a different index of refraction. The bottom reflector 101 is formed on an appropriate substrate that is not shown in the figure.

It should be noted that the terms "top, bottom, vertical and horizontal" used throughout this application are not meant as limiting terms but merely describe directions and positions with respect to the substrate on which the VCSEL device is formed. For example, a bottom-emitting VCSEL device does not necessarily emit radiation "downwardly" but instead refers to a device wherein the radiation passes through the substrate or passes through the "bottom" mirror that has initially been formed directly on the substrate, which may entirely be removed after completion of the VCSEL device. Similarly, the term "vertical" indicates a direction perpendicular to the major surface of a wafer on which a VCSEL device is typically formed.

Between the bottom reflector 101 and a top reflector 102, a cavity 103 is sandwiched including the laser active region of the VCSEL device 100. On top of the reflector 102, a phase-coupling region 104 is formed, thereby defining a plurality of VCSEL elements 105. In the embodiment illustrated in FIG. 1, the phase-coupling region 104 is represented by a metal grid defining the square shaped VCSEL elements 105. As shown, the VCSEL elements 105 are arranged as a 2×2 cross array. It should be noted, however, that the present invention is also applicable to any appropriate arrangement that ensures a suitable phase-coupling between adjacent VCSEL elements to provide a polarization stable output. For example, a 1×2, 1×3, etc. as well as arrays containing more than 4 laser pixels are in accordance with the present invention. Finally, a phase-matching layer 106 comprising GaAs and having a specified optical thickness is provided between the phase-coupling region 104 and the top reflector 102.

In operation, an injection current is continuously provided to the cavity 103 by, for example, the bottom electrode (not shown) and the phase-coupling region 104, which in the present example, is formed as a stack of layers comprising respectively of Pt, Ti, Pt and Au. Due to the phase-coupling region, i.e. the grid 104, the reflectivity of the top reflector 102 is periodically changed in a plane perpendicular to the major emission direction of the VCSEL device 100. As a consequence of this reflectivity modulation, a reflectivity difference exists between a region not covered by the phase-coupling region 104 which may also be referred to as a radiation window and the regions covered by the grid 104. This reflectivity difference leads to an entrancement of a single radiation super mode, namely the one having the smallest mirror loss across the entire array. Furthermore, the modulation of the reflectivity determines the coupling strength between the adjacent optical resonators, i.e. between adjacent VCSEL elements 105. An insufficient reflectivity difference makes the VCSEL elements 105 behave like a single, large multi-mode VCSEL device. Too large a reflectivity difference, on the other hand, will reduce the coupling strength to the point where the coupling entirely disappears and the array starts to behave like an array of individual non-coupled laser elements.

Figure 2:
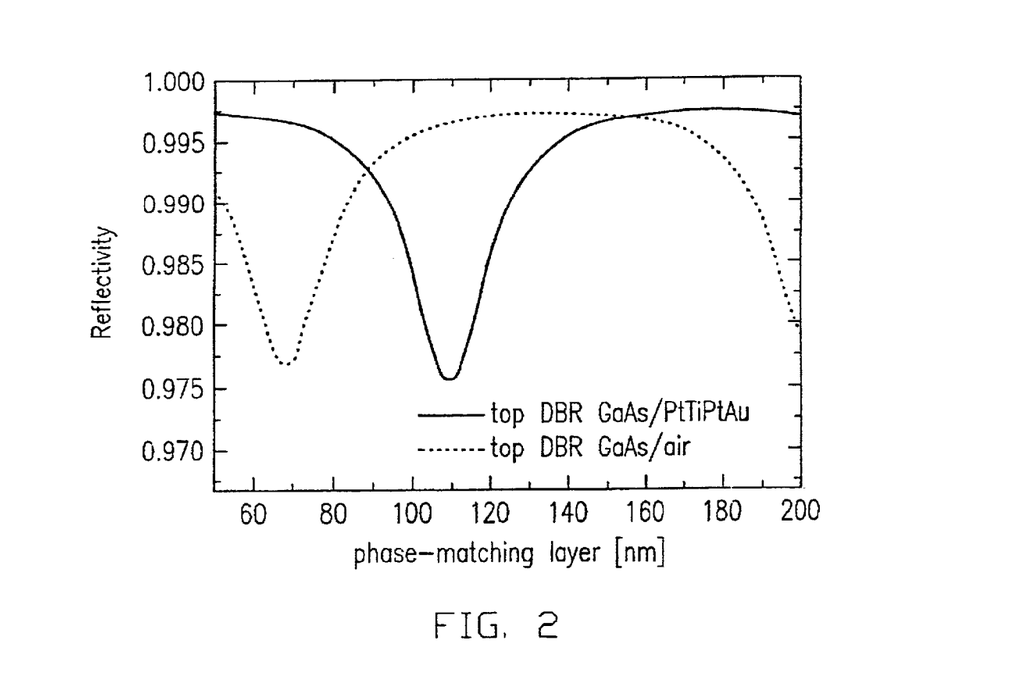
FIG. 2 is a diagram depicting the results of a calculation of the reflectivity difference between an undisturbed portion of the resonator of the VCSEL device and a portion covered by a metal grid; the calculation refers to the VCSEL device depicted in FIG. 1, having a top Bragg reflector with a specified number of layers, a specified phase-matching layer and a specified metal grid on top of the Bragg reflector.

FIG. 2 shows the results of a calculation of the reflectivity of the top Bragg reflector 102 for a given number of layers as a function of thickness of the phase-matching layer 106. The solid liner in FIG. 2 represents the results of the calculation of the reflectivity of the reflector 102, the cavity 103, the phase-matching layer 106 and the phase-coupling region 104. As previously explained, in the present case, the phase-coupling region 104 comprises a PtTiPtAu layer stack. The dotted line in FIG. 2 denotes the results of the calculations referring to the reflectivity of the cavity 103 the top reflector 102 and the phase-matching layer 106 without the grid 104, thereby assuming an air/GaAs interface for the radiation exiting the phase-matching layer 106. As can be seen from FIG. 2, a thickness of 116 nm for the phase-matching layer 106 results in a reflectivity difference of about 1.5%. With a 4×4 $\mu m^2$ area of each VCSEL element 105 and a width of 1 $\mu m$ of the stripes of the grid 104, a single radiation mode is established in the VCSEL array in which each VCSEL element 105 radiates in a single mode with a phase difference of 180° to the nearest neighbors. This type of phase-coupling is also referred to as out of phase-coupling. Depending on the coupling strength, i.e. the width of the stripes of the grid 104 and the reflectivity difference provided by, for example, a phase-matching layer as described in the present embodiment, an in-phase mode may also be excited wherein the radiation of adjacent VCSEL elements 105 is in phase. It should be noted that a different number of layers of the Bragg reflector and/or different materials in the phase-matching layer and/or the metal grid will result in a different reflectivity difference.

As previously explained, VCSEL devices are fabricated on crystalline substrates having a surface orientated in the [100] direction. Due to the crystallographic orientation of the surface, the radiation generated in a VCSEL element is polarized in the [011] or [01-1] orientation, except for a small elliptical component. A quantum-mechanical probability for selecting a certain polarization direction depends on a variety of parameters so that in general, the initial polarization direction with which the VCSEL device starts operation is not predictable and a high probability exists for spontaneously changing the polarization direction due to unavoidable quantum-mechanical fluctuations. One source leading to a drastically enhanced probability for polarization flips is increasing the injection current required for obtaining a maximum output power. As a consequence, conventionally operated single mode devices with high output power frequently change their polarization direction and are, thus, not usable in polarization-sensitive applications. According to the inventors' findings, the adverse influence of local quantum-mechanical fluctuations on the probability for polarization flips can be eliminated by phase-coupling of at least two adjacent VCSEL elements. The operation of a corresponding arrangement allows to vary the injection current over the entire range available for single mode operation substantially without polarization flips. In particular, the inventors found that the 2×2 array as depicted in FIG. 1 does rot show any polarization flips in any of the VCSEL elements 105, even if the injection current is varied across the entire single mode operation region. It should be noted that the present invention is. also applicable to arrangements with two to an arbitrary number of VCSEL elements, whereby presently the maximum number of elements is limited by the homogeneity of the wafer on which the VCSEL elements are formed. Moreover, although the method of stabilizing polarization of a plurality of VCSEL elements is described with reference to a top emitting VCSEL device comprising a phase-matching layer, the present invention is also applicable to bottom emitting devices and to devices without a phase-matching layer as long as the coupling strength is suitably adjusted.

Under certain circumstances, it may be advantageous to maximize the output power by providing as much "active" laser region as possible and reducing the area occupied by the phase-coupling region 104 to a minimum. In this case, the phase-coupling region 104 may be reduced in width down to 0.1 μm while on the other hand, the reflectivity difference is adjusted to a value of about 1–15%. The relatively large value of the reflectivity difference then leads to the required lowering of the coupling strength to obtain the required polarization-stabilizing effect according to the present invention. Without suitably reducing the coupling strength, the entire structure would act as one single large VCSEL device with a high output power but lacking the advantages of a single mode radiation.

In an illustrative embodiment (not shown in the figures), a phase-coupling region, for example in the form of a metal grid, is arranged between the two mirror means such as distributed Bragg reflectors depicted in FIG. 1 and is thus located in the vicinity of the active region of the VCSEL device. According to this arrangement, the reflectivity difference between an "active" resonator area and a region corresponding to the phase-coupling region can be increased more effectively such that a reflective difference of 3–10% and even 15% can be achieved. Consequently, adjacent VCSEL elements may be closely arranged with a spacing down to about 0.1 μm, thereby still exhibiting a suitable coupling strength to avoid polarization flips during operation, as is explained in the foregoing chapter.

Figure 3:
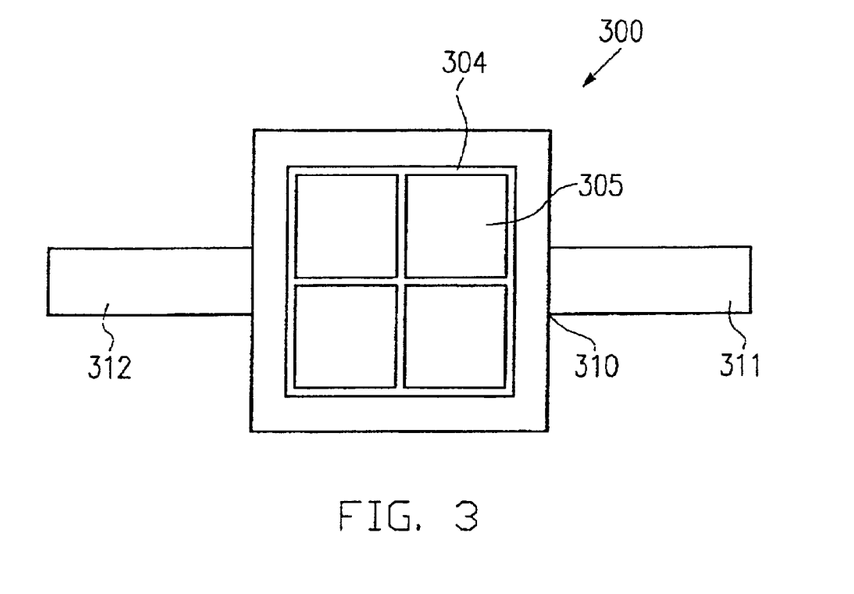
FIG. 3 is a schematic top view of a further embodiment of the present invention illustrating a VCSEL device having a polarization adjusting means.

In many applications, it may be advantageous to select the initial polarization direction or even to switch the polarization direction during operation of the VCSEL device. FIG. 3 schematically shows a top view of a further embodiment of the present invention, depicting a VCSEL device having a polarization adjusting means. In FIG. 3, a VCSEL device 300 comprises a pair of mirror means and an active region arranged therebetween, which for the sake of clarity, are not shown in the figure. On top of the top mirror means, a grid 304 is formed defining a plurality of VCSEL elements 305 arranged as a 2×2 array. As in the previous embodiment, the grid 304 may comprise a stack of metal layers formed from, for example, Pt, Ti, Pt, Au. Moreover, the VCSEL device 300 comprises polarization adjusting means 310 that is provided in the form of a stack of strain layers containing a large amount of aluminum that has selectively been oxidized during formation of the mesa containing the top mirror means. The polarization adjusting means 310 comprises two opposing longitudinal elements 311 and 312 respectively, which are also formed during selectively oxidizing the stack of layers containing, in an alternating manner, a high amount of aluminum and a relatively low amount of aluminum. Due to the different degree of shrinkage occurring during the oxidization of the aluminum, an orientation-dependent strain is generated in the VCSEL device which in turn leads to the stabilizing of one polarization direction in each of the VCSEL elements 305. In the embodiment depicted in FIG. 3, each individual VCSEL element 305 experiences substantially the same mechanical strain. Thus, in each VCSEL element 305, the same polarization direction is established upon injecting of a current, which is then, according to the principle of polarization-stabilizing by phase-coupling, maintained irrespective of the amount of injection current. It should be noted, however, that the polarization adjusting means 310 representing a strain element is not limited to the embodiment shown in FIG. 3, For example, a plurality of strain elements may be provided for a larger laser array whereby the strain orientation may be different for different strain elements. Thus, it is possible to energize a first group of laser elements belonging to a first strain orientation and then energize the laser elements belonging to a second group corresponding to a second strain orientation such that the polarization direction may be selected by energizing the corresponding group of laser elements. Furthermore, when dividing the laser elements into two groups of different polarization directions, both groups may be energized simultaneously with the same injection current or with a varying injection current such that the resultant radiation is polarized in accordance with the applied injection currents. Preferably, the strain elements are arranged such that the phase-coupling of the entire array is maintained to obtain coherence of the radiation emitted by the total array.

In a further embodiment (not shown in the figures), a polarization adjusting means comprises a heating means, for instance in the form of a resistance layer, which locally generates heat in the VCSEL device in an orientation-dependent manner so as to produce strain by thermal stress. It is also possible to incorporate a region of different thermal conductivity so that heat created in the active region during operation of the device is inhomogeneously transported and hence an inhomogeneous thermal stress is generated within the device, resulting in the preference of a certain polarization direction.

In further embodiments (not shown in the figures), asymmetric arrays and/or asymmetric shapes of the individual VCSEL elements may be used to define an initial polarization direction. For example, instead of square shaped elements, rectangular elements registered in conformity with the crystallographic orientation of the substrate may be used. Moreover, the stripes of the grid, for example, the stripes of the grid 304 shown in FIG. 3, may be used as electrodes for providing the injection current to the VCSEL device. In this case, only the stripes extending along one direction, for instance, the vertical direction in FIG. 3, may be connected to an external power supply, whereas the laterally extending stripes are isolated from the upwardly extending stripes, so that the resulting injection current is orientation-dependent and leads to the establishment of a preferred polarization direction. Moreover, the vertical and horizontal stripes can be connected to individually adjustable power supplies so as to provide a different injection current in the respective directions. This would allow to effectively use the grid 304 as an injection electrode while still maintaining an orientation-dependent application of the current to the VCSEL device. The electrical insulation between the upwardly extending and the laterally extending stripes may be obtained, for instance, by providing an insulation layer between the upward and the lateral stripes, which may be formed from silicon nitride and the like. It should be noted that although in this embodiment as well as in the embodiments previously described, reference is made to square shaped and rectangular VCSEL elements, likewise polygonal, preferably symmetric VCSEL elements such as hexagonal or diamond-shaped elements may be used. Advantageously, a hexagonal structure is used for VCSEL arrays that are operated in an in-phase mode since operation of this array in an out-of-phase mode would require a lot of non-lasing elements due to the large number of nearest neighbors Without phase-coupling, which would considerably reduce the efficiency of the entire array.

Figure 4:
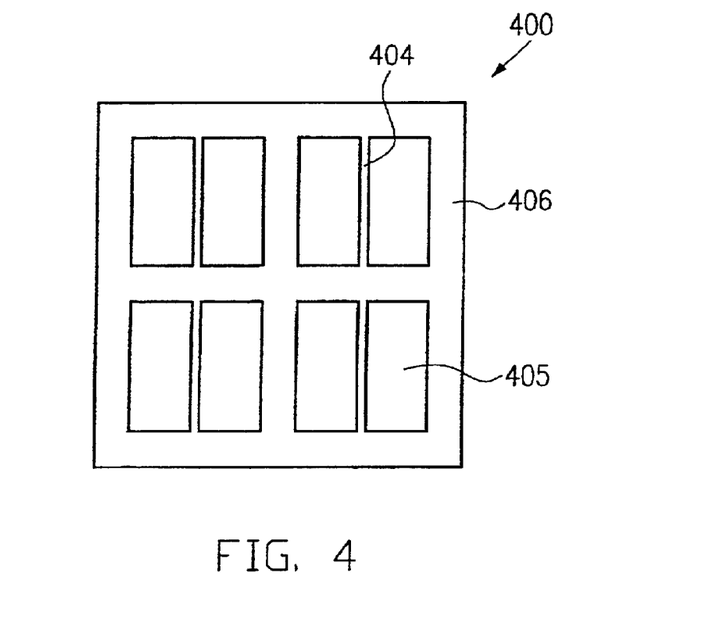
FIG. 4 schematically shows a top view of a further embodiment of the present invention comprising a grid layer, wherein crossing stripes of the grid layer are electrically insulated against each other and receive different injection currents.

FIG. 4 schematically shows a top portion of a VCSEL device according to a further embodiment of the present invention. In an VCSEL device 400, an active region is arranged between a first and a second mirror means, which are not shown in the figure. On top of the top mirror means, a metal grid 404 is provided that defines a plurality of VCSEL elements 405 which are arranged as a 2×2 array. Between the metal grid 404 and the top mirror means, with respect to the vertical direction, a phase-matching layer is provided, the optical thickness of which is adjusted such that a reflectivity difference of about 1% to about 3% between the laser elements 405 and the region covered by the metal grid 404 is achieved. A second grid layer 406, for example comprising silicon nitride, is provided and sub-divides each VCSEL element 405 into two or more sub portions. Due to the difference in their refractive index, the metal grid 404 and the second grid 406 provide a different reflectivity difference with respect to the uncovered portions of the VCSEL elements. For instance, the second grid 406 may provide a reflectivity difference of about 0.5%.

In operation, due to the further modulation of the reflectivity difference, a pre-defined polarization direction is established upon injecting current into the VCSEL device 400. Accordingly, the polarization direction is predetermined and will be maintained throughout operation of the device.

What is claimed is:

1. A method of stabilizing the polarization of a vertical cavity surface emitting laser (VCSEL) device, comprising:

forming a plurality of symmetrical VCSEL elements capable of emitting substantially a single mode radiation of substantially the same wavelength and arranged to have a laterally patterned reflectivity so as to allow phase coupling between at least two of the plurality of symmetrical VCSEL elements;

providing a phase-coupling region having a lateral dimension and a longitudinal dimension, substantially perpendicular to the major emission direction of the VCSEL device, the lateral dimension being less than the longitudinal dimension, wherein the lateral dimension is in the range from about 7 $\mu$m to about 0.1 $\mu$m, and initiating emission of radiation by injecting current within a range assuring a single mode of operation into the at least two of the plurality of VCSEL elements to produce phase-coupled radiation, wherein the polarization direction of each of the at lease two of the plurality of symmetrical VCSEL elements remains substantially constant during operation and exhibit an equal probability for radiating in one of two linear polarization states.

2. The method of claim 1, wherein in each VCSEL element, a radiation window is provided with a size from about 40 $\mu m^2$ to about 1 $\mu m^2$.

3. The method of claim 1, wherein a reflectivity difference between a resonator region corresponding to a radiation window of each of the VCSEL elements and a phase-coupling region provided between adjacent VCSEL elements is selected to be within about 0.5% to 15%.

4. The method of claim 3, further comprising:

providing a phase-coupling region, at least partially, as an electrically conductive material.

5. The method of claim 4, wherein the phase-coupling region is provided on top of a distributed Bragg reflector to define radiation windows corresponding to each VCSEL element.

6. The method of claim 4, wherein the phase-coupling region is used as an injection electrode for injecting current.

7. The method of claim 4, wherein the phase-coupling region is provided as a grid layer vertically arranged between a first mirror means and a second mirror means.

8. The method of claim 4, further comprising:

providing a second phase-coupling region dividing each of the VCSEL elements into two or more sub portions, the second phase-coupling region generating a second reflectivity difference between resonator regions covered by the second phase-coupling region and resonator regions not covered by the second phase-coupling region, wherein the second reflectivity difference differs from the reflectivity difference created by the phase-coupling region.

9. The method of claim 1, wherein two to five VESEL elements are provided.

10. The method of claim 1, wherein the at least two of the plurality of VCSEL elements are top-emitting VCSEL elements.

11. The method of claim 1, wherein the at least two of the plurality of VCSEL elements are arranged as an array defined by a phase-coupling region formed on top of a top Bragg reflector of the VCSEL device.

12. The method of claim 11, wherein the phase-coupling region is provided as a grid layer, that is at least partially conductive, and is used to inhomogeneously inject current.

13. The method of claim 12, wherein stripes of said grid layer extending along a first direction and stripes extending along a second direction are supplied with different currents respectively.

14. The method of claim 13, wherein a radiation emitting surface of each of the VCSEL elements is substantially of square shape, rectangular shape, diamond shape, or hexagonal shape.

15. The method of claim 11, wherein the array is asymmetric.

16. The method of any of claims 1 to 15, further comprising:
providing a polarization adjusting means to select a pre-defined polarization direction.

17. The method of claim 16, further comprising:
providing a strain element in the polarization adjusting means to produce orientation-dependent strain in one or more of the VCSEL elements.

18. The method of claim 17, further comprising:
providing a means for selecting a pre-defined orientation of said orientation-dependent strain.

19. The method of claim, 1 wherein the VCSEL elements are operated in a continuous wave mode.

20. A polarization-stable VCSEL device comprising:
two to five phase-coupled VCSEL elements having a common resonator placed in an array, with each of said phase-coupled VCSEL elements being configured to provide a substantially identical probability for lasing in two different linear polarization states when operated in a single mode; and
a phase-coupling region comprising a reflectivity difference adjusted by a phase-matching layer placed between the phase-coupled VCSEL elements,
wherein, during operation within a drive current range assuring a single mode of operation, the polarization direction of each of the phase-coupled VCSEL elements remains substantially constant due to the phase-coupling of the phase-coupled VCSEL elements.

21. The polarization-stable VCSEL device of claim 20, wherein:
the phase-matching layer is on top of a distributed Bragg reflector, the phase-matching layer adjusting a reflectivity difference of the VCSEL resonator area below a radiation window and below a region separating two adjacent VCSEL elements to about 0.5 to about 3%.

22. The polarization-stable VCSEL device of claim 20 further comprising a grid layer.

23. The polarization-stable VCSEL device of claim 22, wherein said grid layer generates a reflectivity difference of about 0.50% to 15%.

24. The polarization-stable VCSEL device of claim 22, wherein a width of stripes of the grid layer is in the range of about 7 $\mu$m to about 0.1 $\mu$m.

25. A polarization-stable VCSEL device comprising:
a plurality of phase-coupled VCSEL elements placed in an array;
a phase-coupling region comprising a reflectivity difference adjusted by a phase-matching layer placed between each of said plurality of phase-coupled VCSEL elements, wherein during operation with a drive current within a range assuring a single mode of operation the polarization direction of each of the VCSEL elements remains substantially constant in a pre-defined polarization direction due to the phase-coupling of the VCSEL elements and exhibiting a substantially equal probability for radiating in one of two linear polarization states; and
a polarization adjusting means provided in one or more of the phase-coupled VCSEL elements to select the pre-defined polarization direction.

26. The polarization-stable VCSEL device of claim 25, wherein the polarization adjusting means comprises a strain element to produce an orientation-dependent strain in one or more of the phase-coupled VCSEL elements.

27. The polarization-stable VCSEL device of claim 26, wherein said strain element comprises a strain layer including one or more shrunk material layers to create said orientation-dependent strain.

28. The polarization-stable VCSEL device of claim 25, wherein the polarization adjusting means comprises electrodes adapted to allow inhomogeneous injection of current into the VCSEL elements.

29. The polarization-stable VCSEL device of claim 28, wherein said electrodes are arranged in accordance with a crystallographic orientation of a substrate on which the VCSEL devise is formed.

30. The polarization-stable VCSEL device of claim 28, wherein electrodes oriented in a first crystallographic direction are electrically insulated from electrodes oriented in a second crystallographic direction.

31. The polarization-stable VCSEL device of claim 25, wherein the plurality of phase-coupled VCSEL elements are arranged in an array defined by a grid layer comprising electrically conductive portions.

32. The polarization-stable VCSEL device of claim 31, wherein first stripes of the grid layer extend along a first direction and second stripes extend along a second direction whereby a width of the first stripes is less than a width of the second stripes.

33. The polarization-stable VCSEL device of claim 31 or 32, wherein said array is asymmetric.

34. The polarization-stable VCSEL device of claim 31, wherein each element of the array is of square shape.

35. The polarization-stable VCSEL device of claim 31, wherein each element of the array is of rectangular shape.

36. The polarization-stable VCSEL device of claim 25, wherein respective emission windows of said plurality of VCSEL elements are of polygonal shape.

37. The polarization-stable VCSEL device of claim 31, wherein a width of stripes of the grid layer is in the range of about 7 $\mu$m to about 0.1 $\mu$m.

38. A vertical cavity surface emitting laser array device comprising:
a first reflector;
a second reflector;
a cavity placed between said first and second reflector;
a plurality of vertical cavity surface emitting laser elements formed on said first reflector; and
a phase coupling region having a laterally patterned reflectivity so as to couple phases of said plurality of vertical cavity surface emitting laser elements,
whereby the polarization direction of at least two of said plurality of vertical cavity surface emitting laser elements remain substantially constant during operation.

39. A vertical cavity surface emitting laser array device as in claim 38 wherein:
said phase coupling region comprises a metal grid.

40. A vertical cavity surface emitting laser array device as in claim 38 wherein:

said phase coupling region comprises a reflectivity difference between a resonator region of one of said plurality of vertical cavity surface emitting laser elements and said phase coupling region.

41. A vertical cavity surface emitting laser array device as in claim 40 wherein:

the reflectivity difference is selected to be within 0.50 and 15 percent.

42. A vertical cavity surface emitting laser array device as in claim 38 further comprising:

means, associated with at least two of said plurality of vertical cavity surface emitting laser elements, for providing a desired polarization direction.

43. A method of stabilizing the polarization of a vertical cavity surface emitting laser array device comprising:

forming a plurality of vertical cavity surface emitting laser elements; and phase coupling at least two of the plurality of vertical cavity surface emitting laser elements, whereby the polarization direction of the at least two of said plurality of vertical cavity surface emitting laser elements remain substantially constant during operation.

44. A vertical cavity surface emitting laser array device comprising:

a first reflector;

a second reflector;

a cavity placed between said first and second reflector;

a plurality of vertical cavity surface emitting laser elements formed on said first reflector, said plurality of vertical cavity surface emitting laser elements having a first reflectivity; and a grid formed adjacent said plurality of vertical cavity surface emitting laser elements, said grid having a predetermined width and a second reflectivity;

said first reflectivity and said second reflectivity having a reflectivity difference between 1 and 15 percent, whereby a phase coupling region is formed between said plurality of vertical cavity surface emitting laser elements resulting in the polarization direction of radiation from said plurality of vertical cavity surface emitting laser elements remaining substantially constant during operation.

45. A vertical cavity surface emitting laser array device as in claim 44 further comprising:

a phase matching layer having a predetermined thickness formed adjacent said second reflector, wherein the predetermined width of said grid and the predetermined thickness of said phase matching layer are adjusted so as to cause phase coupling between said plurality of vertical cavity surface emitting laser elements.

46. A method of operating a polarization sensitive application using vertical cavity surface emitting laser elements whereby the polarization of the vertical cavity surface emitting laser elements is established, the method comprising:

providing two or more vertical cavity surface emitting laser elements having a common optical resonator and emitting substantially a single mode radiation of substantially the same wavelength when drive current is injected into the two or more vertical cavity surface emitting laser elements, the two or more vertical cavity surface emitting laser elements each being configured to have a substantially identical probability for establishing two different linear polarization states when operated in the single mode regime, said common resonator having a laterally patterned reflectivity so as to couple the phases of the two or more vertical cavity surface emitting laser elements; and supplying an output radiation of the two or more vertical cavity surface emitting laser elements to said polarization sensitive application, wherein said output radiation is substantially devoid of polarization flips between said two linear polarization states within a drive current range assuring a single mode operation.

47. A polarization-stable vertical cavity surface emitting laser device, wherein the vertical cavity surface emitting laser device is configured to provide its total output radiation by an arrangement of two to five phase-coupled vertical cavity surface emitting laser elements wherein during operation the polarization direction of each of the vertical cavity surface emitting laser elements remains substantially constant, each vertical cavity surface emitting laser element being configured to provide a substantially identical probability for lasing in two different linear polarization states when operated in the single mode regime, said two to five vertical cavity surface emitting laser elements having a common resonator, wherein a lateral reflectivity of the resonator is patterned by a phase matching layer and a grid layer.

* * * * *